United States Patent [19]
Lin

[11] Patent Number: 5,300,821
[45] Date of Patent: Apr. 5, 1994

[54] POWER CONTROLLER

[75] Inventor: Aaron Lin, Taipei, Taiwan

[73] Assignee: Lei Chu Enterprise Co., Inc., Taipei, Taiwan

[21] Appl. No.: 888,180

[22] Filed: Aug. 4, 1992

[51] Int. Cl.⁵ .......................... H03K 4/08; H03K 5/04
[52] U.S. Cl. .................................. 307/265; 307/228; 307/261; 307/598
[58] Field of Search ............... 307/261, 265, 228, 362, 307/264, 253, 639, 643, 598; 328/13, 22, 53

[56] References Cited

U.S. PATENT DOCUMENTS

| | | | |
|---|---|---|---|
| 3,491,254 | 1/1970 | Van Ness | 307/598 |
| 4,016,498 | 4/1977 | Hadley | 307/228 |
| 4,047,052 | 9/1977 | Koubek et al. | 307/228 |
| 4,276,860 | 7/1981 | Capurka | 307/228 |
| 4,302,688 | 11/1981 | Havel et al. | 307/639 |
| 4,843,265 | 6/1989 | Jiang | 307/228 |
| 5,079,452 | 1/1992 | Tisinger et al. | 307/228 |
| 5,130,582 | 7/1992 | Ishihara et al. | 307/228 |

FOREIGN PATENT DOCUMENTS 188122  7/1992  Taiwan .

OTHER PUBLICATIONS

Holt, "Electronic Circuits-Digital and Analog", published by John Wiley & Sons, Inc., 1978, pp. 443-444.

Primary Examiner—William L. Sikes
Assistant Examiner—Toan Tran
Attorney, Agent, or Firm—Lovercheck and Lovercheck

[57] ABSTRACT

A power controller capable of controling electric loads accurately and stably is described, which is to regulate the power supply of the electric load and to reform it to be rectangular electric pressure pulse and is characterized by having current mirror circuit, comparators, condensor and voltage follower.

1 Claim, 2 Drawing Sheets

POWER CONTROLLER

BACKGROUND OF INVENTION (1) Field of the Invention

The present invention relates to a power controller which can accurately and stably control electric loads such as the power consumption of electric heat and light facilities.

(2) Prior Art

Generally, the power consumption can not be accurately and stably controlled, because no such controller as disclosed in this invention has been adopted.

Consequently, how to control power consumption stably and accurately is a problem to be studied and solved with efforts.

The present invention is a result of such efforts, which is capable to control power accurately and stably.

BRIEF DESCRIPTION OF THE DRAWINGS

The features and principles of the present invention will be more readily understood from the following detailed description, when considered in conjunction with the accompanying drawings in which.

DETAILED DESCRIPTION

Figure 1:
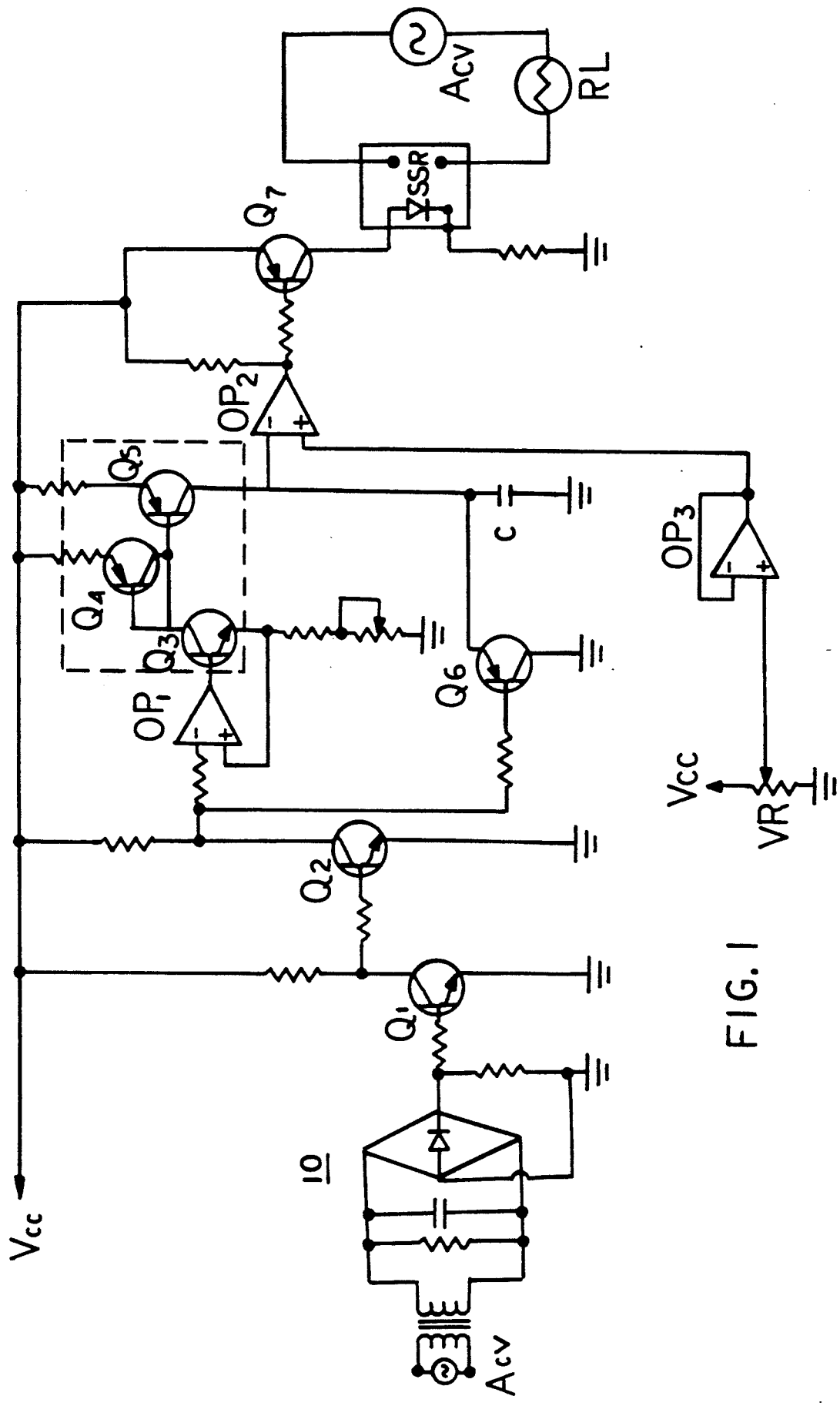
FIG. 1 depicts the circuit of an embodiment of the invention.
Figure 2A:
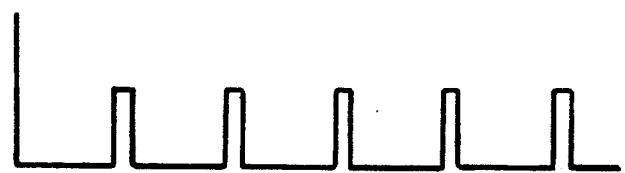
FIG. 2a depicts the rectangular electric pressure pulse produced from the transistor Q1 of the circuit depicted in FIG. 1.
Figure 2B:
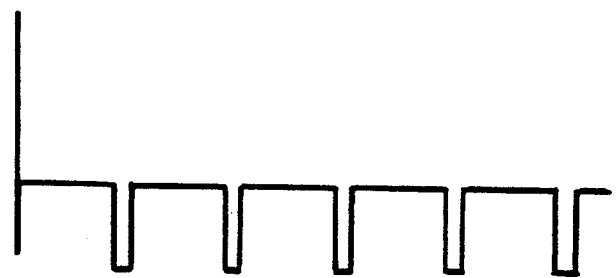
FIG. 2b depicts the rectangular electric pressure pulse produced from the transistor Q2 of the circuit depicted in FIG. 1.

First of all, please refer to FIG. 1, the input electric source of rectifier 10 is of the same common power supply as the electric source of electric load RL. The rectifier 10 is a bridge rectifier and its output is a ripple current. As the transistor Q1 is triggered, its collector produces the electric pressure pulse as shown in FIG. 2a, while the collector of transistor Q2 produces the electric pressure pulse as shown in FIG. 2b and inputs into the non-inverting input of comparator OP1. The current mirror circuit consisting of transistors Q3, Q4 and Q5 are therefore triggered. According to the principle of current mirror circuit, once the transistors Q3, Q4 and Q5 are triggered by the electric pressure output pulse of comparator OP1, the emitter of transistor Q3 and the collector of transistor Q5 shall have the equivalent current, and the collector of the transistor Q5 shall charge up the condenser C with constant current VRs is a variable resistor for adjusting the voltage on comparator OP1 and transistor Q3. Variable resistor VR1 adjusts the voltage level on transistor Q3.

However, because

|  | Q = CV | (1) |
|---|---|---|
|  | Q = it | (2) |
| therefore | it = CV | (3) |
|  | V = i/C × t | (4) |

In the above formula (4), i and t are all constant, thus V =kt. Consequently, the end pressure of condenser C is in direct proportion to charging time. In other words, just before the end of direct pressure output pulse, the end pressure of condenser C reaches the top point as shown as H in FIG. 3.

When the non-inverted phase input of the comparator OP1 turns to negative direction pulse, the transistors Q3, Q4 and Q5 of the current mirror circuit are disconnected. The condenser C is thus rapidly discharging to the transistor Q6 so as to produce -the saw-tooth wave as shown in FIG. 3 and input into the inverted phase input of the comparator OP2.

The inverted phase input of the comparator OP2 is connected to the input of a voltage follower OP3, while the non-inverted phase input of the voltage follower OP3 is connected to a direct current power supply VCC and adjusted with a variable resistor VR.

Figure 3:
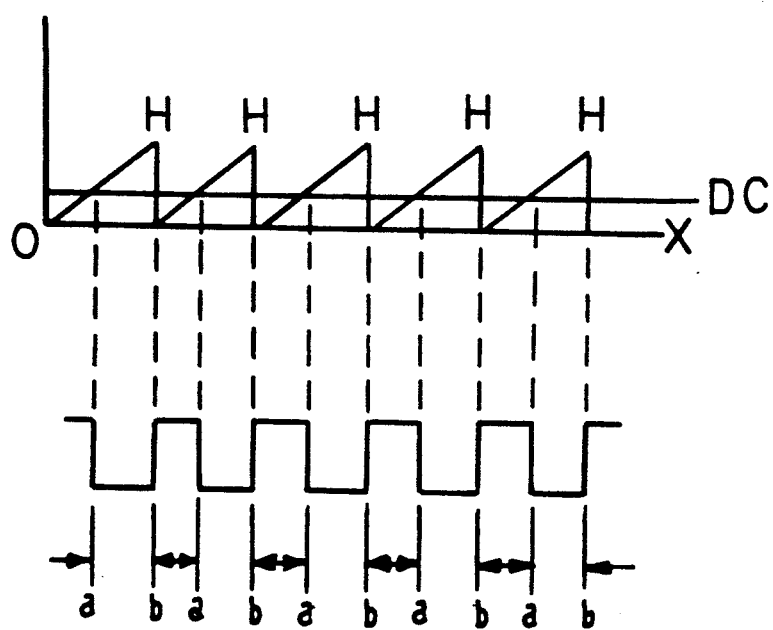
FIG. 3 depicts the sawtooth wave produced by the circuit depicted in FIG. 1 in comparison with an adjustable direct current pressure and the trigger electric pressure pulse of a solid state relay resulted therefrom.

Suppose that the direct current electric pressure level DC output from the voltage follower OP3 is as shown in FIG. 3, the comparator OP2 will immediately output the rectangular pressure pulse as shown in FIG. 3. The transistor Q7 is thus connected between the negative direction period a to b. The solid state relay SSR is thus triggered and the electric load is supplied with power source so as to work. Solid state relay SSR may be a SCR or other thermister.

Consequently according to the above mentioned load to increase the power of the electric load, we are only to adjust the variable resistor VR to have the direct current output pressure of the voltage follower OP3 decrease to below zero electric potential. As the OX axis shows in FIG. 3, the electric load RL can obtain a 360 degree full electric power supply. On the contrary to decrease the power of the electric load, it is only necessary to increase the direct current electric pressure level of the voltage follower OP3. If the direct current electric pressure level of the voltage follower OP3 is increased up to or over the top point H of the saw-tooth wave, the transistor Q7 is stopped and the solid state relay SSR is thus disconnected. Consequently, the electric load RL can not obtain the power supply.

According to the above mentioned, it is clear that to adjust the variable resistor VR to gradually increase or decrease the direct current output electric pressure level of the voltage follower OP3 so as to accurately control the angle of current conduction of the solid state relay and in turn to accurately control the -power consumption. As the controling angle of the present power controller can be up to 360 degrees the electric load RL can still work stably without flashing, even if the current conducting angle of the solid state relay is very small. Such function is not obtainable with the conventional circuit controller.

Up to this date and to the knowledge of the inventor, no device identical with or similar to the present one has been seen in use or in publication. Therefore, this invention is with novelty and with industrial utilization value.

What is claimed is:

1. A controller for controlling a power source for an electric load;

said controller comprising a source of ripple current;

a first comparator and a second comparator;

a current mirror circuit connected to an electronic element;

an electronic means connecting said source of ripple current to a square wave;

said first comparator being connected between said electronic means and said mirror circuit;
a source of direct current connected to a non-inverting input of said second comparator through a voltage follower;
a condenser;
a solid state relay for connecting said power source to said load;
an inverting input of said second comparator being connected to said mirror circuit and to said condenser for charging said condenser from said mirror circuit;

said condenser being adapted to discharge to said electronic element (Q6) so as to produce a sawtooth wave and to input said saw tooth wave to said inverting input of said second comparator;
an output of said second comparator being connected to said solid state relay;
the output of said second comparator being connected to said solid state relay whereby said load is connected to a source of electrical power by said solid state relay in response to the output of said second comparator.

* * * * *